United States Patent
Cosco et al.

(10) Patent No.: US 7,812,488 B2
(45) Date of Patent: Oct. 12, 2010

(54) ELECTRONICALLY COMMUTATED EXTERNAL ROTOR MOTOR WITH A CIRCUIT BOARD

(75) Inventors: Pino Cosco, St. Georgen (DE); Klaus S. Fischer, Hardt (DE)

(73) Assignee: EBM-Papst St. Georgen GmbH & Co. KG, St. Georgen (DE)

(*) Notice: Subject to any disclaimer, the term of this patent is extended or adjusted under 35 U.S.C. 154(b) by 15 days.

(21) Appl. No.: 12/034,952

(22) Filed: Feb. 21, 2008

(65) Prior Publication Data

US 2008/0218011 A1    Sep. 11, 2008

(30) Foreign Application Priority Data

Mar. 6, 2007    (DE)    ...................... 20 2007 003 812

(51) Int. Cl.
    *H02K 29/08*    (2006.01)
(52) U.S. Cl. .................. 310/68 E; 310/71; 310/81; 310/68 B; 257/659
(58) Field of Classification Search .............. 310/71, 310/68 B, 156.08, 81; 257/659
    See application file for complete search history.

(56) References Cited

U.S. PATENT DOCUMENTS

| 4,806,808 | A |   | 2/1989 | Grecksch et al. ............. 310/71 |
| 5,510,664 | A | * | 4/1996 | Suzuki et al. ................ 310/268 |
| 5,721,463 | A | * | 2/1998 | Snyder ....................... 310/334 |

| 2001/0048255 | A1 |   | 12/2001 | Sorenson et al. ............... 210/71 |
| 2006/0232148 | A1 | * | 10/2006 | Chen ........................ 310/68 B |

FOREIGN PATENT DOCUMENTS

DE    295 20 176 U    5/1996

OTHER PUBLICATIONS

Wikipedia, Definition of ZAMAK alloy (expired US TM 222,098); 2 pages.
Patent Abs. of Japan, abstracting JP 04-325 852-A, AZUMA/CANON, published Nov. 16, 1992 (one page).
Patent Abs. of Japan, abstracting JP 09-311 057-A, KOMAI/MATSUSHITA., published Dec. 2, 1997 (one page).

* cited by examiner

*Primary Examiner*—Quyen Leung
*Assistant Examiner*—Terrance Kenerly
(74) *Attorney, Agent, or Firm*—Oliver Intellectual Property; Milton Oliver, Esq.

(57) ABSTRACT

An electronically commutated motor (ECM 21) has reduced vulnerability to Electro-Static Discharge (ESD). The motor has an internal stator (50) and an external rotor (22) equipped with a permanent magnet (28), which rotor is separated by an air gap from the internal stator (50). The rotor has a shaft (34) on which a magnetic yoke element (24) is mounted. A leakage flux region on an end face (27) of the magnet (28) actuates a Hall sensor (48) located adjacent a first aperture (48') in a circuit board (46) supporting electronic control components. In order to prevent static discharges from passing through the first aperture (48') and endangering the electronic components, the circuit board (46) is formed with a second aperture (43) on whose edge is provided at least one electrical conductor (95', 95"), connected to ground (112), to which any charge that builds up during operation can harmlessly discharge.

13 Claims, 5 Drawing Sheets

ELECTRONICALLY COMMUTATED EXTERNAL ROTOR MOTOR WITH A CIRCUIT BOARD

FIELD OF THE INVENTION

The present invention relates to an electronically commutated external-rotor motor having a circuit board.

BACKGROUND

In such electronically commutated motors (ECMs), a circuit board is used to support electronic components for controlling the motor. A so-called "window," i.e. a hole, is provided in this circuit board, and a Hall sensor is arranged adjacent the window, in order to generate rotor position signals. This allows the motor to be compactly designed, since no additional space is needed for the Hall sensor.

In circuit boards of this kind, the problem arises that Electro-Static Discharges (ESDs) can occur during operation; these sparks or discharges can cause damage to the motor, particularly to digital electronic components used to direct motor operations.

It is therefore an object of the present invention to provide a novel electronically commutated external-rotor motor having substantially reduced vulnerability to such ESD events.

SUMMARY OF THE INVENTION

According to the present invention, this object is achieved by a motor whose circuit board is formed with a first aperture adjacent the Hall magnetic sensor and with a second aperture defining a harmless discharge path for any electrostatic discharge, and by a generally disk-shaped circuit board formed with a first aperture adjacent the Hall sensor, at a first circumferential position, and a second aperture, preferably at a second circumferential position remote from the first, equipped with electrical conductors which lead to a grounding element, and thus serve as a kind of "lightning rod."

In this manner, ESDs can occur through an opening or aperture in the circuit board provided therefor, so that the motor is protected in a simple manner from damage or destruction due to such electro-static discharge.

Further details and advantageous refinements of the invention are evident from the exemplifying embodiment, in no way to be understood as a limitation of the invention, that is described below and depicted in the drawings.

BRIEF FIGURE DESCRIPTION

Figure 6:
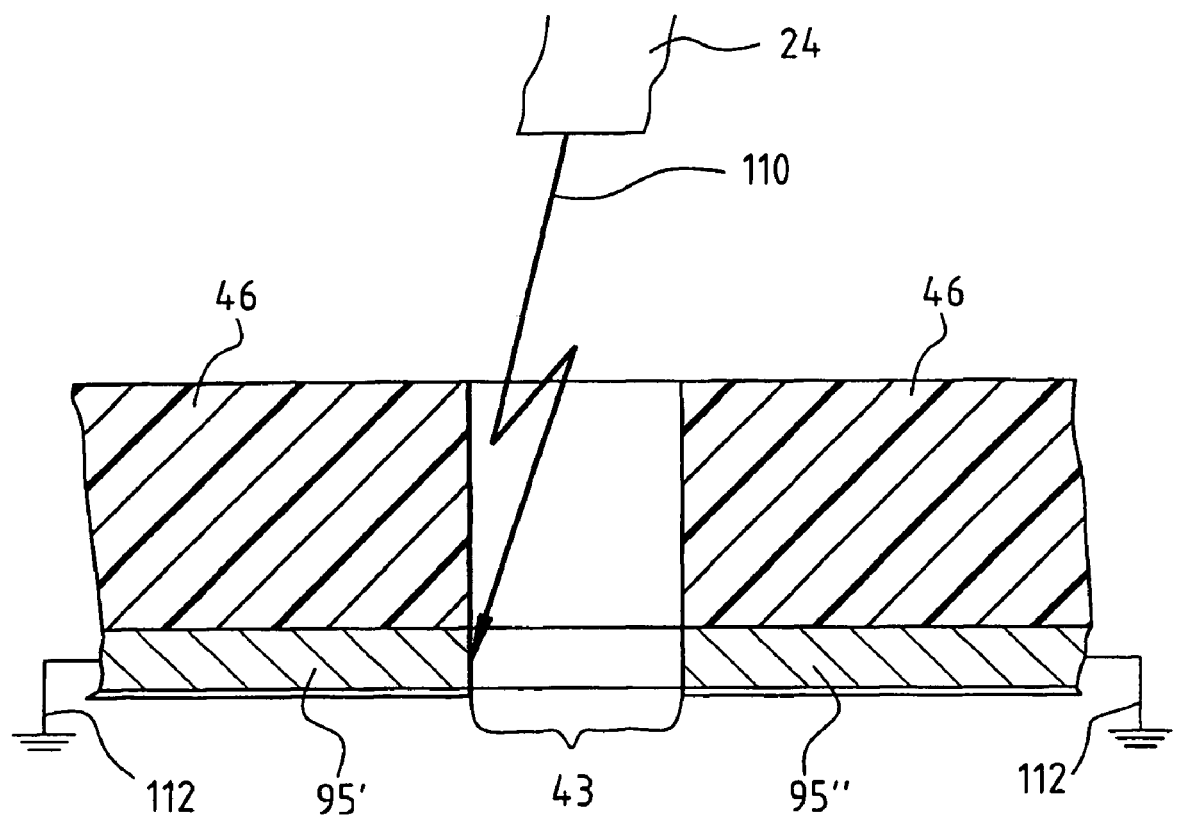

FIG. 6 is a schematic view showing a direct flashover or discharge 110 from yoke 24 to a portion 95', 95" connected to ground 112.

In the description that follows, the terms "left," "right," "upper," and "lower" refer to the respective figure of the drawings, and can vary from one figure to the next as a function of a particular orientation (portrait or landscape) that is selected. Identical, or identically-functioning, parts are labeled with the same reference characters in the various figures, and usually are described only once.

DETAILED DESCRIPTION

Figure 1:
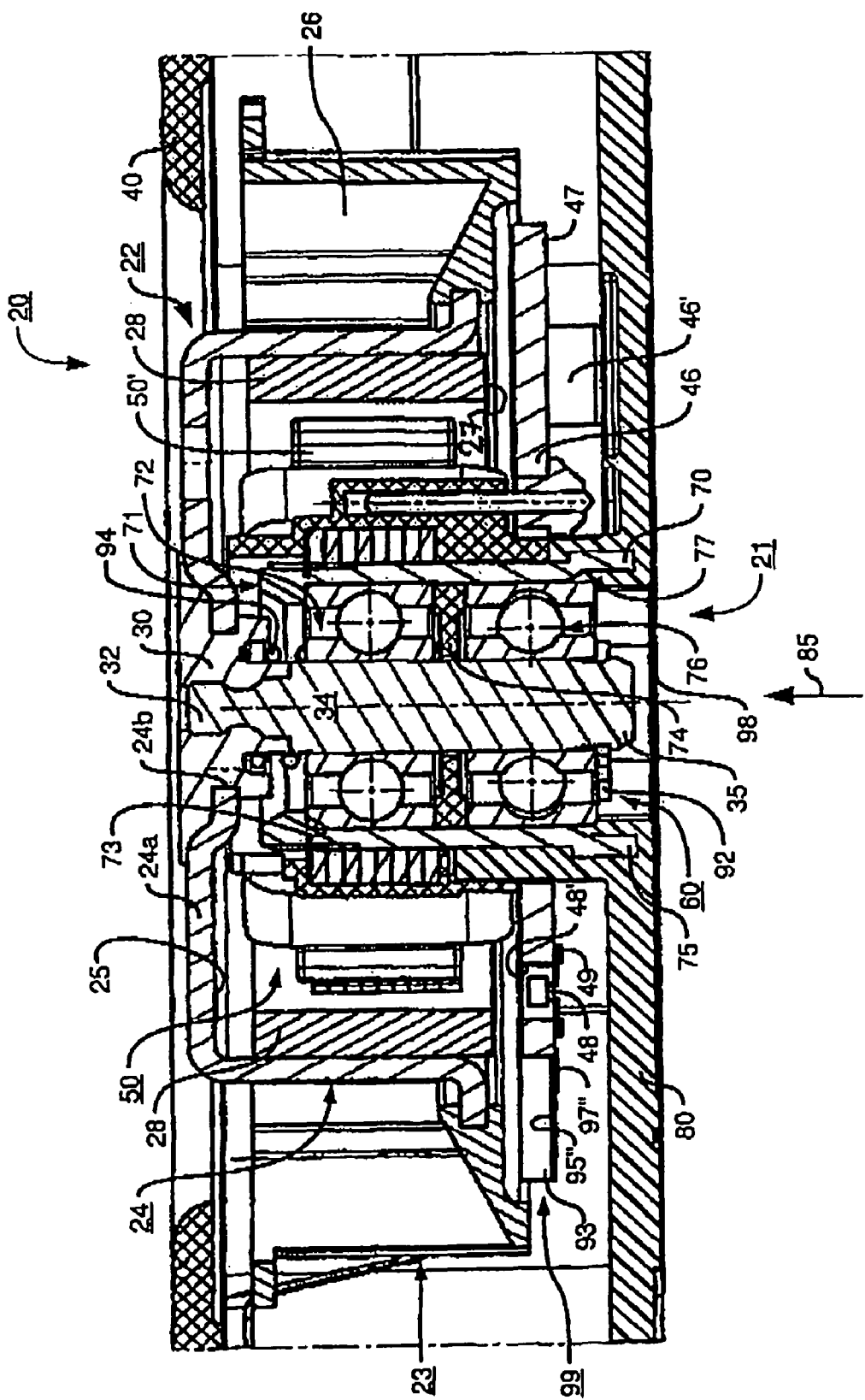
FIG. 1 is a longitudinal section through an exemplifying embodiment of an electronically commutated external-rotor motor.

FIG. 1 is a longitudinal section through a fan 20 having an electronically commutated external-rotor motor 21 and a circuit board 46 according to an embodiment of the present invention. Fan 20 is depicted at greatly enlarged scale, by way of example, as a radial fan. It could alternatively, for example, be an axial fan or a diagonal fan. In a practical embodiment of the fan such as the one shown in FIG. 1, the height is approximately 15 mm and the width approximately 51 mm, i.e. FIG. 1 depicts this fan enlarged approximately 4.5 times. Other fan types in other sizes can, of course, likewise be equipped with correspondingly modified circuit boards.

Motor 21 has an external rotor 22, an internal stator 50 having a stator lamination stack 50', and a bearing tube 70 mounted on a plastic part 80. With this design, bearing tube 70, as well as an external rotor 22 journaled in it, are insulated by the plastic part. The rotor is separated from internal stator 50 by an air gap, and has a rotor cup 24 configured as a cup-shaped carrier or yoke element and made of magnetically conductive metal, e.g. deep-drawn soft iron. Cup 24 has on its external circumference a fan wheel 23 having fan blades 26. Mounted on the inner periphery of cup 24 is a radially magnetized rotor magnet 28 that can be magnetized with, for example, four poles, six poles, etc. The magnet has a leakage flux region below its lower end face 27. The magnetic flux therefrom is detected by a nearby Hall magnetic flux sensor. Rotor cup 24 has a bottom 24a having a central opening 24b that is connected via a hub 30 (made of a die-casting alloy such as ZAMAK (trademark for a zinc-aluminum-magnesium-copper alloy or the like) to upper end 32 of a rotor shaft 34 that has a lower shaft end 35, which lower end serves for journaling in the bearing tube 70.

Located in bearing tube 70 is a bearing arrangement 60 that, in this example, has at the top a first rolling bearing 72 and at the bottom a second rolling bearing 76, which are arranged at a predetermined distance from one another. This distance is defined by a spacing member 74, for example (as depicted) an annular disk. Bearing arrangement 60 is not limited to a specific bearing type; plain bearings or a magnetic bearing system can, for example, also be used instead.

The upper (in FIG. 1) end 71 of bearing tube 70 faces toward inner side 25 of rotor cup 24, and is equipped on its inner side with a stop 73 against which outer ring 72" of rolling bearing 72 abuts. Its lower end 75 is equipped internally with an enlargement 78 in order to facilitate introduction of bearings 72, 76 into bearing tube 70.

Lower end 75 of bearing tube 70 is mounted on plastic part 80 by plastic injection molding, in such a way that the plastic injected onto the bearing tube forms a stop 77 against which outer ring 76" of lower bearing 76 abuts. Lower end 75 is covered by an adhered placard 98 made of metal, or by another suitable covering.

Shaft 34 is held by a snap ring 92 latched into an annular groove, and by a compression spring 94 that is arranged between inner ring 72' of bearing 72 and hub 30. Snap ring 92 is pressed by compression spring 94 against second rolling bearing 76, so that bearings 72, 76 are biased against one another.

Figure 4:
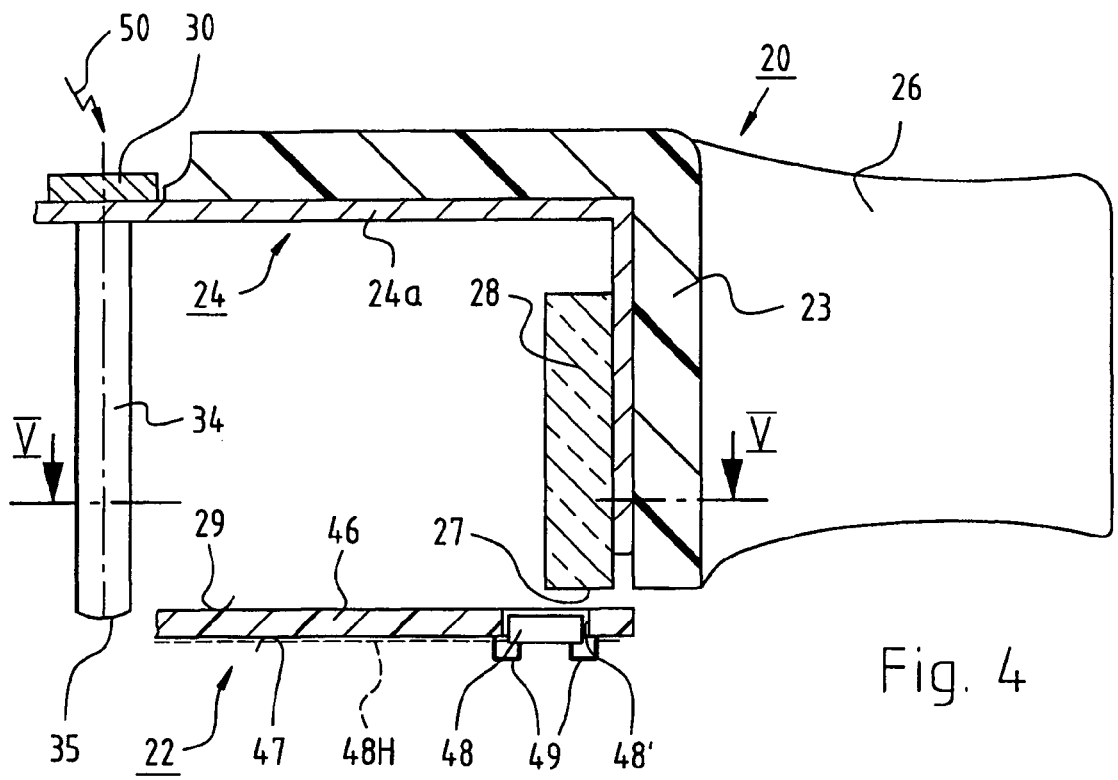
FIG. 4 is a schematic partial longitudinal section through the motor, from which the stator is omitted, for ease of understanding.

Internal stator 50 of motor 21 is mounted on an outer side of bearing tube 70. Also arranged there is a circuit board 46 that has a side 47 facing away from rotor 22, on which side is located a printed circuit having electronic components for said printed circuit, e.g. an integrated circuit (IC) 46'. As shown in FIG. 4, the (upper) side of circuit board 46, facing toward internal stator 50, is labeled 29 and is usually not populated with any components. Circuit board 46 is located in a region between rotor magnet 28 and stator lamination stack 50' on the one hand, and flange 80. The board has an opening or aperture 48', hereinafter referred to as a "Hall window," in which is arranged a flat galvanomagnetic sensor 48 that, during operation, generates rotor position signals controlled by the rotational position of rotor magnet 22 relative to internal stator 50. On its upper side that faces toward the rotor magnet, sensor 48 projects only very little, or not at all, above upper side 29 of circuit board 46, so that only a very small air gap is present between the sensor and end face 27 of rotor magnet 22.

Figure 2:
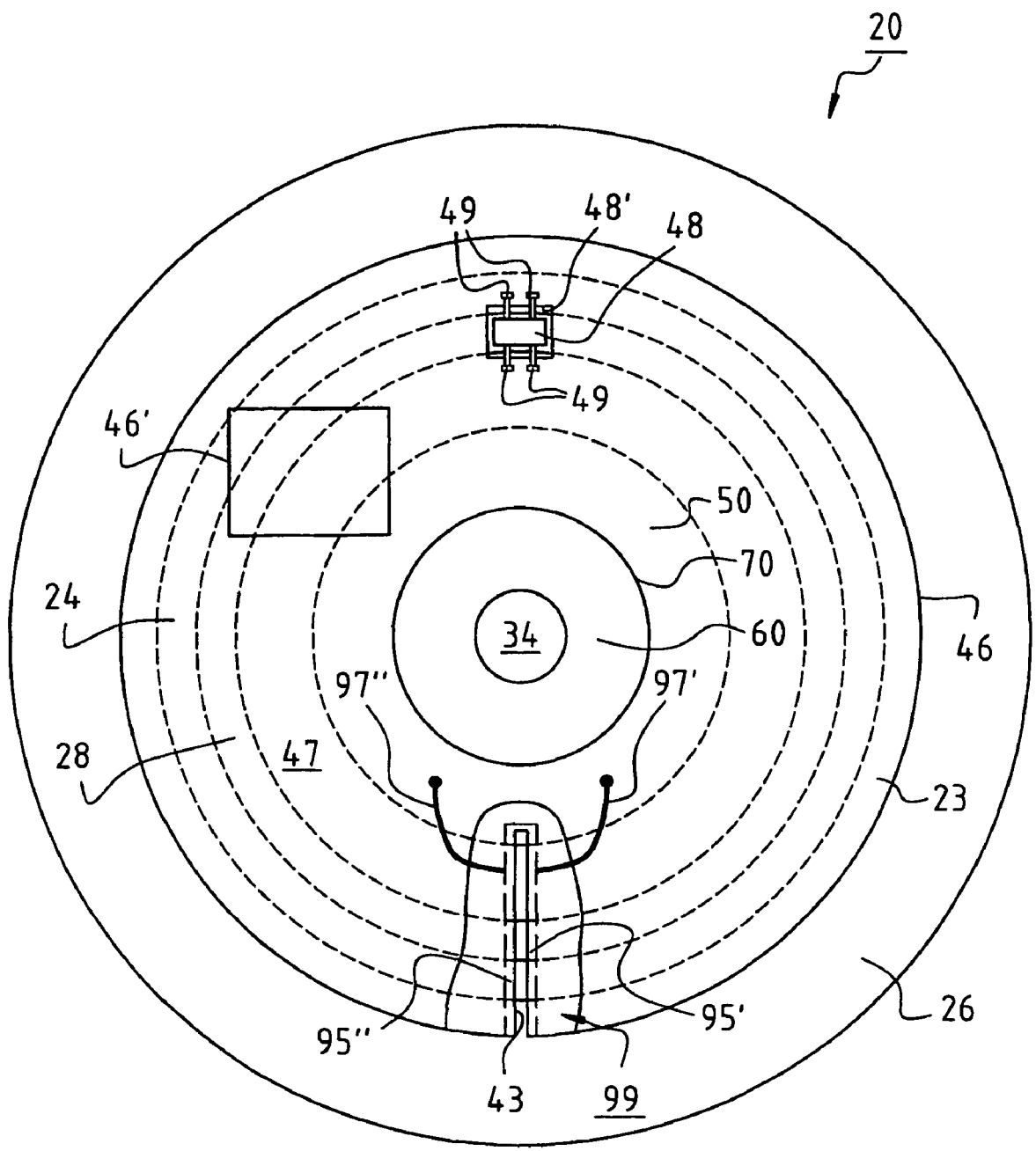
FIG. 2 is a plan view of the underside of a circuit board, preferably disk-shaped, used in the motor of FIG. 1, which board is populated, in the completed motor, with electronic components.

As shown schematically in FIGS. 2 and 4, Hall sensor 48 is connected, via contact feet 49, to conductive tracks 48H that are located on the underside 47 of circuit board 46. Hall window 48I is arranged in a region of circuit board 46 that is located at least partially in the leakage flux region of end face 27 of magnet 28.

In FIG. 1, only a portion of Hall window 48' is located below end face 27 of rotor magnet 28. At this point, the magnetic field of rotor magnet 28 is strong enough to enable reliable generation of rotor position signals by Hall sensor 48. At the same time, the latter is then far enough away from rotor cup 24 to permit reliable operation, as will be explained below, when the mode of operation is described.

To protect motor 21 from electrostatic discharges, the latter has a dissipation arrangement 99 to dissipate undesired charges away from the motor. This arrangement comprises a (second) aperture 43 in circuit board 46. This aperture can be manufactured, for example, by milling a radial slot or groove into circuit board 46 from the outer rim of circuit board 46. Provided adjacent the bottom of this slot 43, on side 47 of circuit board 46, is at least one electrical conductor 48L connected to a low potential (usually to ground), which conductor is depicted, by way of example, in FIG. 1 as a metallic coating 95', 95". This metallic coating is, in this embodiment, connected via conductors 97', 97" to the low potential. Many variants are, of course, possible here.

Arrangement 99 is configured in such a way that, upon the occurrence of electrostatic discharges that may have a voltage of, for example, several kV, a preferred flashover 110 (FIG. 6) from rotor cup 24 to metallic coating 95', 95" on either side of aperture 43 is enabled, so that such a flashover or spark proceeds harmlessly and cannot cause damage to circuit board 46 and its components. For example, in the embodiment shown in FIG. 2, second aperture 43 is remote from first aperture 48' by placing it at a radially opposite position on disk-shaped board 46.

FIG. 2 is a plan view of populated side 47 of circuit board 46 on which the electronic components are located, and shows the electrical connection of sensor 48 by means of its contact feet 49, as well as a possible configuration of arrangement 99. The latter has, at each edge of slot 43, a planar conductor 95', 95" that is connected via an associated line 97', 97" to ground or to another potential. Metallic coatings, usually made of copper, are preferably used as conductors 95', 95".

Figure 3:
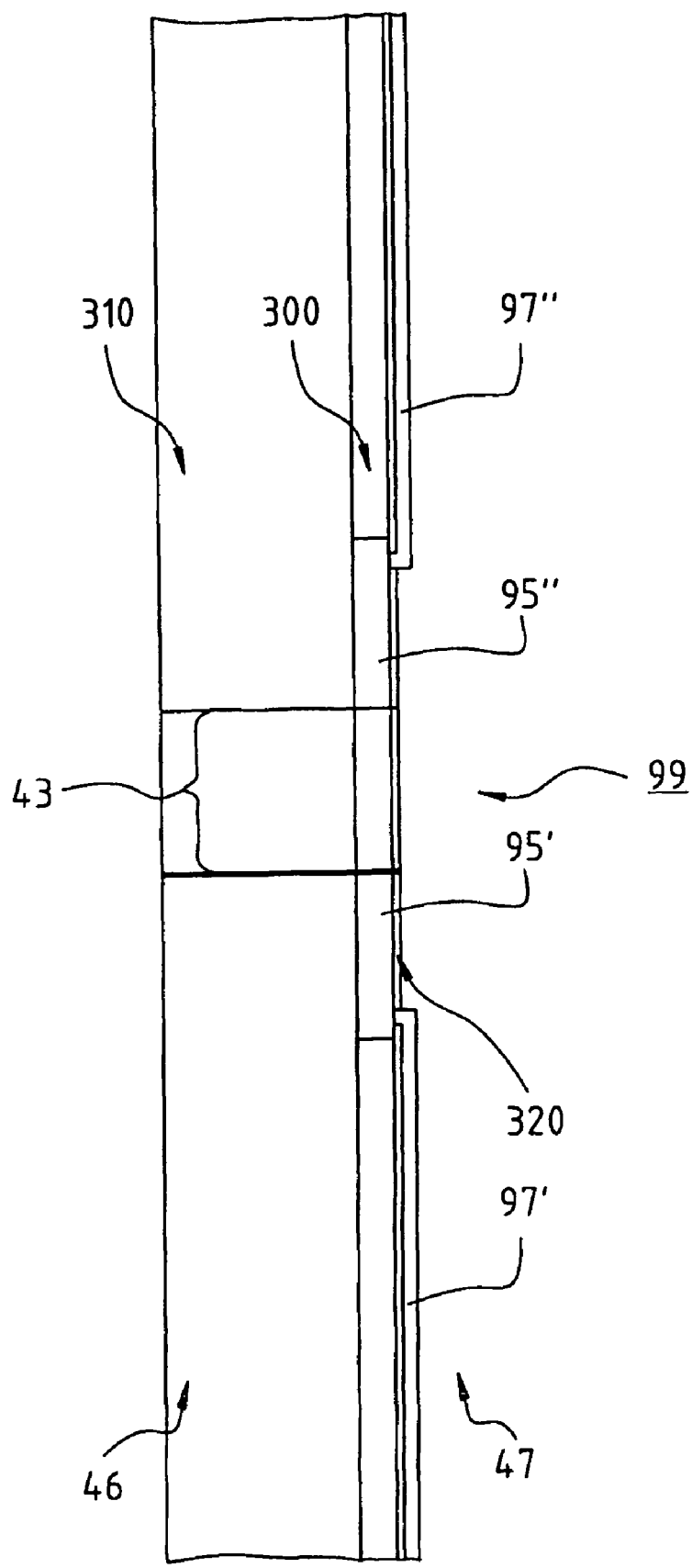
FIG. 3 is a greatly enlarged side view of a portion of the circuit board of FIGS. 1 and 2.

FIG. 3 is a greatly enlarged side view of circuit board 46 to elucidate arrangement 99 according to FIGS. 1 and 2. The insulating circuit board is labeled 310. Located thereon are a copper layer 300 and a solder stop layer 320.

As FIG. 3 shows, conductors 95', 95" can be rapidly produced by removing solder stop layer 320, since the result thereof is that metal layer 300 is exposed in these regions. Alternatively, additional electrical conductors can be arranged in these regions, for example by being soldered on.

Manner of Operation

Figure 5:
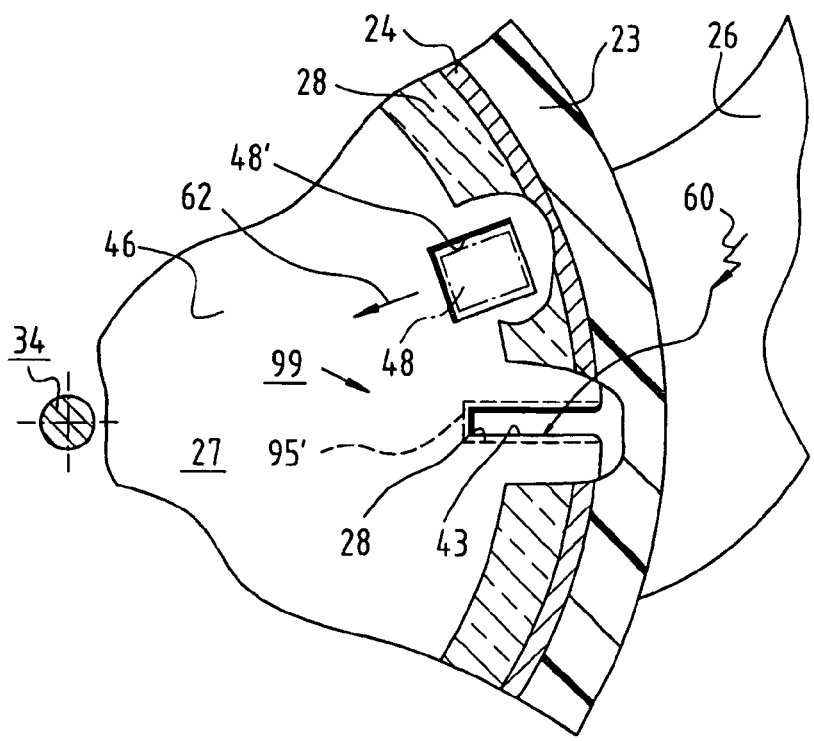
FIG. 5 is a section viewed along line V-V of FIG. 4.

FIGS. 4 to 6 are highly schematic depictions to explain the manner of operation. The stator is not depicted (with the exception of circuit board 46) in FIG. 4, in order to simplify the depiction.

FIG. 4 shows how rotor 22 of a fan 20 is exposed to an electrostatic discharge 50 that strikes at hub 30. Because rotor 22 is electrically insulated, the electrical charge cannot flow to ground via shaft 34, and the metallic cup 24 of the fan wheel consequently becomes charged.

Because unpopulated side 29 of circuit board 46 faces upward, circuit board 46 itself would act as an insulator and prevent a flashover. However, Hall window 48', in which Hall sensor 48 is located, is present in circuit board 46. As FIG. 1 shows, Hall sensor 48 has connector elements 49 that are soldered in the usual fashion to conductive paths on underside 47 of circuit board 46. In prior art structures without a second aperture, Hall window 48' and these connector elements 49 then make possible a flashover of the charge stored on rotor 22. Specifically, this flashover proceeds from magnetic yoke 24 through Hall window 48' to electrical connectors 49 of sensor 48; this usually results in the destruction of Hall sensor 48, thereby also making motor 21 incapable of functioning, since once the control circuit has lost its Hall sensor input signal representing rotor position, it no longer knows when to trigger commutation.

Hall window 48' is preferably offset slightly inward radially, as indicated by an arrow 62 in FIG. 5, so that it is located below end face 27 of rotor magnet 28. This enlarges the air gap with respect to cup or yoke 24. Also provided is slot 43, which allows charge to dissipate from cup or yoke 24 through said slot 43 to portions 95', 95" on circuit board 46 that are connected to ground, as FIG. 6 shows. The effectiveness of slot 43 as a discharge path is insensitive to mechanical tolerances or manufacturing variations and, when separately connected to ground, slot 43 offers a good electrostatic discharge path without being damaged by any such discharge. This slot could therefore be referred to metaphorically as the motor's "lightning rod," and a lightning symbol 60 is therefore drawn in FIG. 5 at the approximate point where the discharge takes place. Even when an electrostatic discharge happens at aperture 43, this is sufficiently far away from aperture 48' that any voltage surge induced at Hall sensor 48 by the discharge is small enough to be harmless; in layman's terms, this keeps the sensor chip from being "fried." In this simple manner, it is possible to make an ECM of this kind resistant to high voltage, without substantial additional cost.

FIG. 6 once again schematically depicts circuit board 46. Circuit board 46 acts as an insulator in terms of the electrostatic voltages with which magnetic yoke or cup 24 can become charged during operation. Opening 43 is therefore provided in circuit board 46, representing an air section at whose lower end are located portions 95, 95" that are connected directly to ground 112.

When yoke 24 has become sufficiently charged, a flashover 110 takes place from yoke 24 to one of portions 95', 95", since this represents the shortest and lowest-resistance connection from yoke 24 to ground 112. Sensor 48 is thereby protected from destruction. Opening 43, in combination with portions 95', 95", thus acts in principle as a "lightning rod" and protects sensor 48 from destruction by flashovers.

Numerous variations and modifications are of course possible, within the scope of the present invention.

What is claimed is:

1. An electronically commutated external-rotor motor (21) comprising
    an internal stator (50);
    an external rotor (22) equipped with a permanent magnet (28), which rotor is separated by an air gap from the internal stator (50) and has, for journaling on the stator,
    a shaft (34) on which is mounted a yoke element (24) made of magnetically conductive material and on which yoke element the permanent magnet (28) is arranged, which magnet has a leakage flux region adjacent an end face (27) thereof, facing toward an opening of the yoke element (24);
    a circuit board (46) arranged on the internal stator (50), which board is equipped, on a side (47) thereof, facing away from the external rotor (22), with a printed circuit (46', 48);
    a first aperture (48') provided in the circuit board (46) in said leakage flux region of the permanent magnet (28), in which aperture is arranged a galvanomagnetic sensor (48) that generates, during motor operation, rotor position signals as a function of a rotational position of the rotor (22) relative to the stator (50);
    a second aperture (43) provided in the circuit board (46), at an edge of which aperture is provided an electrical conductor (95', 95") connected to ground (112), to which conductor any charge, that builds up in the motor (21) during operation, can discharge.

2. The motor according to claim 1, further comprising
    a connector (300), provided on the circuit board (46), which conductor forms, at least in part, an electrical conductor (95', 95") connected to ground.

3. The motor according to claim 1, wherein
    at least one electrical conductor (95', 95"), connected to a low potential, is formed as a metallic coating at least on a side (47) of the circuit board (46) facing away from the external rotor (22).

4. The motor according to claim 3, wherein
    the metallic coating (95', 95") is connected to ground or to a low potential.

5. The motor according to claim 1, wherein
    the second aperture (43) is arranged, at least in part, in said leakage flux region of the permanent magnet (28).

6. The motor according to claim 1, wherein
    the second aperture (43) extends inward from an outer edge of the circuit board (46).

7. A circuit board (46) for an electronically commutated external-rotor motor (21), which board comprises:
    a first side (47) bearing a printed circuit thereon for connection of electronic components (46');
    a first aperture (48') for reception of a galvanomagnetic sensor (48);
    a second aperture (43) defining an edge, at which edge is provided at least one electrical conductor (95', 95", 97', 97"), connected to ground (112), for the dissipation of any electrostatic discharge (60).

8. The circuit board according to claim 7, wherein
    a ground connector (300) provided in the circuit board (46) forms at least in part an electrical conductor (95', 95", 97', 97") connected to ground (112).

9. The circuit board according to claim 7, wherein said second aperture (43) is located sufficiently far from said first aperture (48') that any electrostatic discharge passing through said second aperture (43) elevates voltage at said sensor (48) by an amount small enough to be harmless to said sensor (48).

10. The circuit board according to claim 7, wherein
    the at least one electrical conductor (95', 95", 97', 97") connected to ground (112) is configured as a metallic coating (95', 95") of the circuit board (46) on the side (47) thereof which bears the printed circuit.

11. The circuit board according to claim 10, wherein
    the metallic coating (95', 95") is connected to ground.

12. The circuit board according to claim 7, wherein
    the second aperture (43) is formed starting at an outer edge of the circuit board (46) and extending away from said edge.

13. The circuit board according to claim 12, wherein said second aperture (43) extends generally radially inward from an outer rim.

* * * * *